United States Patent
Jogan et al.

(10) Patent No.: US 9,640,944 B2
(45) Date of Patent: May 2, 2017

(54) METHOD OF MANUFACTURING OPTICAL SEMICONDUCTOR ELEMENT

(71) Applicant: FUJI XEROX CO., LTD., Tokyo (JP)

(72) Inventors: Naoki Jogan, Kanagawa (JP); Jun Sakurai, Kanagawa (JP); Akemi Murakami, Kanagawa (JP); Takashi Kondo, Kanagawa (JP); Kazutaka Takeda, Kanagawa (JP); Junichiro Hayakawa, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/223,645

(22) Filed: Jul. 29, 2016

(65) Prior Publication Data

US 2017/0070026 A1     Mar. 9, 2017

(30) Foreign Application Priority Data

Sep. 8, 2015    (JP) ................. 2015-176895

(51) Int. Cl.
*H01L 21/00*      (2006.01)
*H01S 5/026*      (2006.01)
(Continued)

(52) U.S. Cl.
CPC ........ *H01S 5/026* (2013.01); *H01L 31/02005* (2013.01); *H01L 31/02161* (2013.01); *H01L 31/022416* (2013.01); *H01L 31/0304* (2013.01); *H01S 5/0208* (2013.01); *H01S 5/0425* (2013.01); *H01S 5/34* (2013.01); *H01S 5/3432* (2013.01); *H01S 5/34353* (2013.01); *H01L 31/075* (2013.01)

(58) Field of Classification Search
USPC ........................................... 438/29
See application file for complete search history.

(56) References Cited

U.S. PATENT DOCUMENTS 7,738,526 B2    6/2010   Onishi
2006/0223011 A1   10/2006   Kaneko

FOREIGN PATENT DOCUMENTS

JP     05-206581 A    8/1993
JP     06013645 A     1/1994
(Continued)

OTHER PUBLICATIONS

Communication dated Aug. 2, 2016, issued by the Japan Patent Office in corresponding Japanese Application No. 2015-176895.
(Continued)

*Primary Examiner* — Timor Karimy
(74) *Attorney, Agent, or Firm* — Sughrue Mion, PLLC

(57) ABSTRACT

A method of manufacturing an optical semiconductor element includes: a first step in which a columnar structure of a semiconductor layer formed on a semi-insulating substrate is formed; a second step in which the substrate is exposed in a periphery of the columnar structure; a third step in which a region including exposed surfaces of the first contact layer and the substrate is pretreated; a fourth step in which a first electrode is formed on the exposed surface of the first contact layer; a fifth step in which an interlayer insulating film is formed in a region including a side surface of the columnar structure and the exposed surfaces; a sixth step in which a first electrode wiring is formed on the interlayer insulating film; and a seventh step in which a second electrode wiring is formed on the interlayer insulating film.

8 Claims, 6 Drawing Sheets

(51) Int. Cl.
    *H01L 31/0224*     (2006.01)
    *H01L 31/02*     (2006.01)
    *H01L 31/0304*     (2006.01)
    *H01L 31/0216*     (2014.01)
    *H01S 5/02*     (2006.01)
    *H01S 5/042*     (2006.01)
    *H01S 5/34*     (2006.01)
    *H01S 5/343*     (2006.01)
    *H01L 31/075*     (2012.01)

(56) References Cited

FOREIGN PATENT DOCUMENTS

| | | |
|---|---|---|
| JP | 06334256 A | 12/1994 |
| JP | 08250817 A | 9/1996 |
| JP | 11354881 A | 12/1999 |
| JP | 2005142499 A | 6/2005 |
| JP | 2006287025 A | 10/2006 |
| JP | 2009-117617 A | 5/2009 |
| JP | 2009-277781 A | 11/2009 |
| JP | 2014132692 A | 7/2014 |
| JP | 2015099870 A | 5/2015 |

OTHER PUBLICATIONS

English Translation of communication dated Nov. 22, 2016, from the Japanese Patent Office in counterpart application No. 2015-176895.

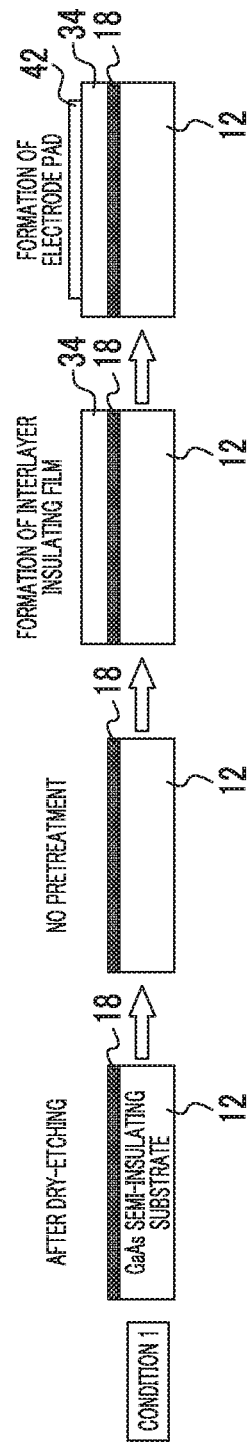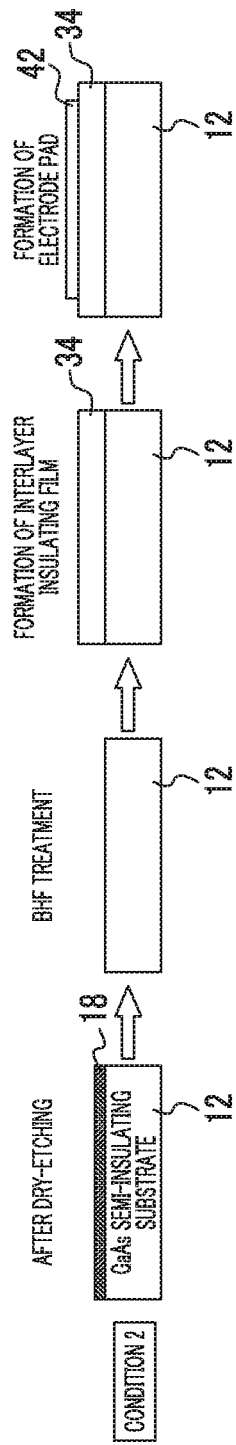

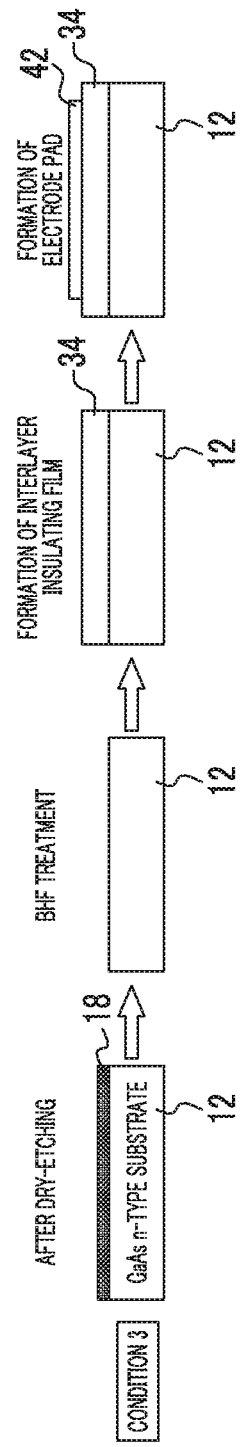
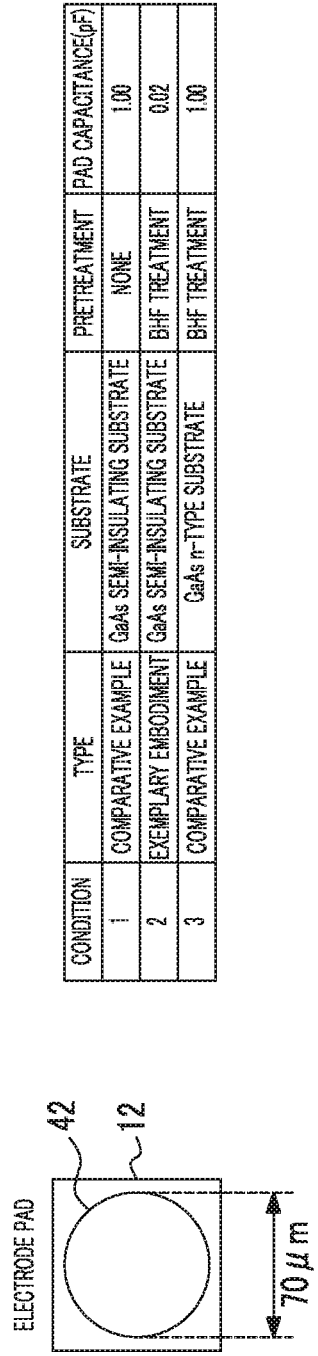

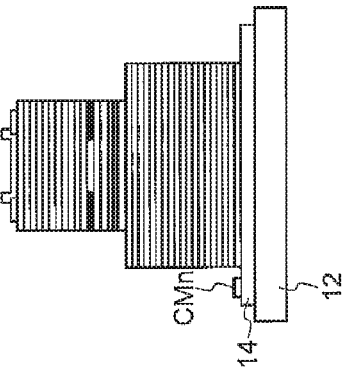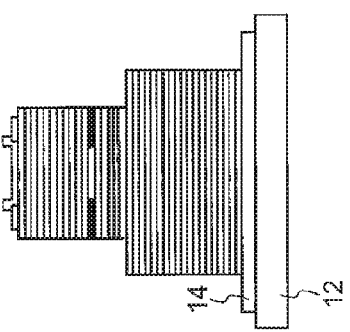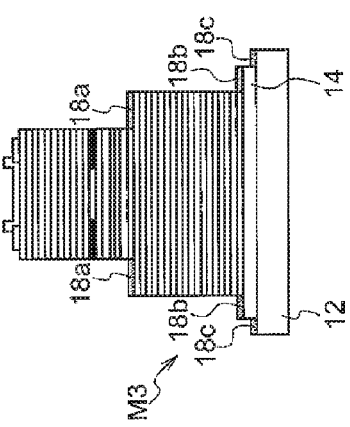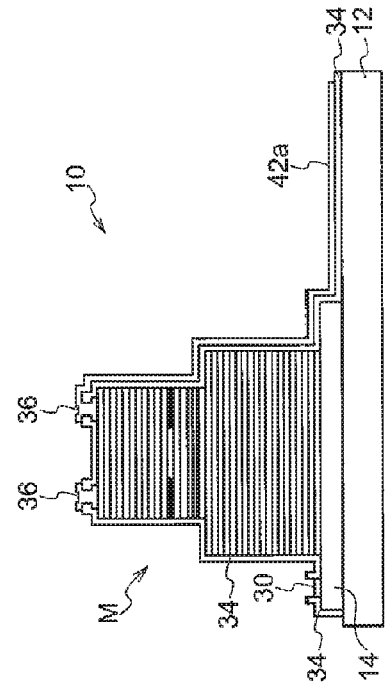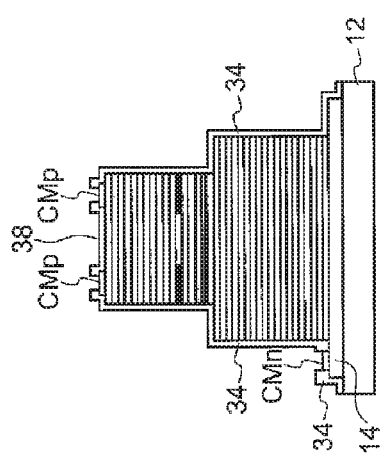

METHOD OF MANUFACTURING OPTICAL SEMICONDUCTOR ELEMENT

CROSS-REFERENCE TO RELATED APPLICATIONS

This application is based on and claims priority under 35 USC 119 from Japanese Patent Application No. 2015-176895 filed Sep. 8, 2015.

BACKGROUND

Technical Field

The invention relates to a method of manufacturing an optical semiconductor element.

SUMMARY

According to an aspect of the invention, a method of manufacturing an optical semiconductor element includes:

a first step in which a columnar structure of a semiconductor layer formed on a semi-insulating substrate and including a first contact layer of a first conductivity type, an active region or a light absorption region on the first contact layer, a second contact layer of a second conductivity type on the active region or the light absorption region, and a second electrode on the second contact layer is formed by dry-etching the semiconductor layer until the first contact layer is exposed;

a second step in which the substrate is exposed in a periphery of the columnar structure by dry-etching the first contact layer;

a third step in which a region including an exposed surface of the first contact layer exposed by the dry-etching and an exposed surface of the substrate is pretreated with acid or alkali;

a fourth step in which a first electrode is formed on the exposed surface of the first contact layer;

a fifth step in which an interlayer insulating film is formed in a region including a side surface of the columnar structure, the exposed surface of the first contact layer, and the exposed surface of the substrate;

a sixth step in which a first electrode wiring connected to the first electrode and extending to the exposed surface of the substrate is formed on the interlayer insulating film, and a first electrode pad is formed on the exposed surface of the substrate; and a seventh step in which a second electrode wiring connected to the second electrode and extending to the exposed surface of the substrate via the side surface of the columnar structure is formed on the interlayer insulating film, and a second electrode pad is formed on the exposed surface of the substrate.

BRIEF DESCRIPTION OF THE DRAWINGS

Exemplary embodiments of the present invention will be described in detail based on the following figures, wherein:

FIGS. 2A to 2E are exemplary diagrams of an evaluation example related to a capacitance reducing effect of electrode pads according to the exemplary embodiment;

FIGS. 4A to 4E are partial vertical sectional views illustrating an example of a manufacturing method of the surface emitting semiconductor laser element according to the first exemplary embodiment.

DETAILED DESCRIPTION

Hereinafter, detailed description will be given of exemplary embodiments for performing the invention with reference to the drawings.

First Exemplary Embodiment

Figure 1A:
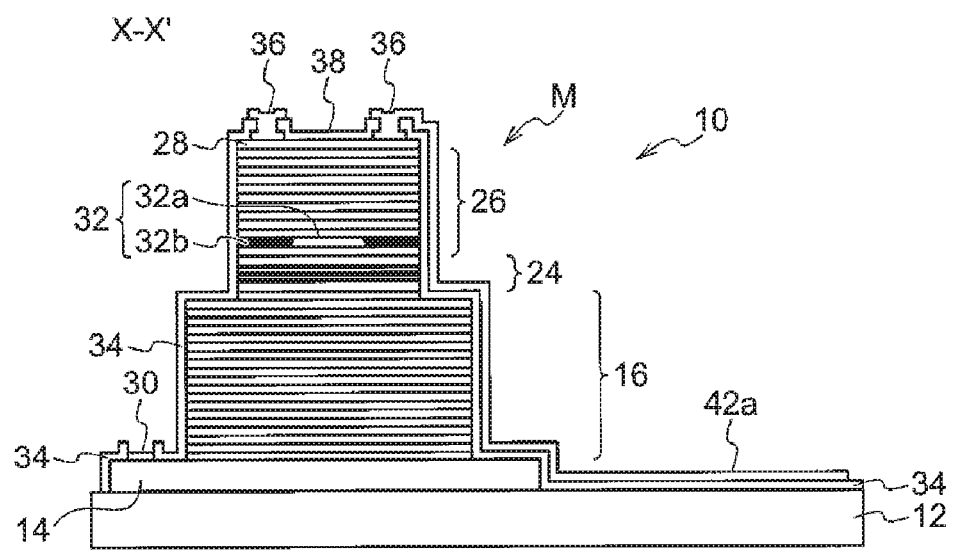
FIGS. 1A and 1B are a sectional view and a plan view illustrating an example of a configuration of a surface emitting semiconductor laser element according to a first exemplary embodiment.
Figure 1B:
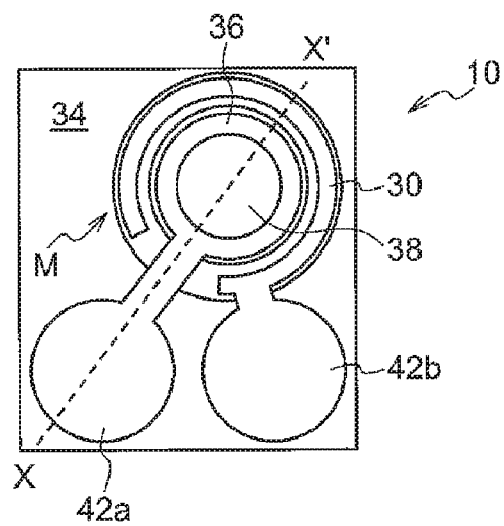

Description will be given of an example of a configuration of a surface emitting semiconductor laser element 10 according to the exemplary embodiment with reference to FIGS. 1A and 1B. FIG. 1A is a sectional view of the surface emitting semiconductor laser element 10 according to the exemplary embodiment, and FIG. 1B is a plan view of the surface emitting semiconductor laser element 10. The sectional view illustrated in FIG. 1A is a sectional view taken along X-X' in the plan view illustrated in FIG. 1B. The surface emitting semiconductor laser element 10 is an example of the optical semiconductor element manufactured by the method of manufacturing an optical semiconductor element according to the exemplary embodiment of the invention.

As illustrated in FIGS. 1A and 1B, the surface emitting semiconductor laser element 10 includes an n-type GaAs contact layer 14 formed on a semi-insulating GaAs (gallium arsenide) substrate 12, a lower distributed Bragg reflector (DBR) 16, an active region 24, an oxidation confining layer 32, an upper DBR 26, and a contact layer 28. In the surface emitting semiconductor laser element 10, the respective configurations including the contact layer 14, the lower DBR 16, the active region 24, the oxidation confining layer 32, the upper DBR 26, and the contact layer 28 form a mesa structure M, and the mesa structure M forms a laser portion.

An interlayer insulating film 34 as an inorganic insulating film is deposited on the circumference of the semiconductor layer including the mesa structure M. The interlayer insulating film 34 extends from a side surface of the mesa structure M to a surface of the substrate 12 and is arranged below an electrode pad 42a. In one example, the interlayer insulating film 34 according to the exemplary embodiment is formed of a silicon nitride film (SiN film). A material of the interlayer insulating film 34 is not limited to the silicon nitride film and may be a silicon oxide film ($SiO_2$ film) or a silicon oxynitride film (SiON film), for example.

As illustrated in FIG. 1A, a p-side electrode wiring 36 is provided via an opening of the interlayer insulating film 34. One end of the p-side electrode wiring 36 is connected to the contact layer 28 to form Ohmic contact with the contact layer 28. In contrast, the other end of the p-side electrode wiring 36 extends from the side surface of the mesa structure M to the surface of the substrate 12 and forms the electrode pad 42a. The p-side electrode wiring 36 is formed by depositing a Ti (titanium)/Au (gold) laminated film, for example.

Similarly, an n-side electrode wiring 30 is provided via an opening of the interlayer insulating film 34. One end of the n-side electrode wiring 30 is connected to the contact layer 14 and form Ohmic contact with the contact layer 14. In contrast, the other end of the n-side electrode wiring 30 extends to the surface of the substrate 12 and forms an electrode pad 42b as illustrated in FIG. 1B (hereinafter, the electrodes pads are also collectively referred to as "electrode pads 42"). The n-side electrode wiring 30 is formed by depositing an AuGe/Ni/Au laminated film, for example.

In one example, the semi-insulating GaAs substrate is used as the substrate 12 according to the exemplary embodiment as described above. The semi-insulating GaAs substrate is a GaAs substrate with no impurities doped. The semi-insulating GaAs substrate has significantly high resistivity, and a sheet resistivity is about several MΩ.

The contact layer 14 formed on the substrate 12 is formed of a Si-doped GaAs layer in one example. One end of the contact layer 14 is connected to the n-type lower DBR 16, and the other end is connected to the n-side electrode wiring 30. That is, the contact layer 14 is interposed between the lower DBR 16 and the n-side electrode wiring 30 and has a function of applying a negative potential to a laser portion formed of the mesa structure M. The contact layer 14 may also function as a buffer layer that is provided to obtain satisfactory crystallinity for the surface of the substrate after thermal cleaning.

The n-type lower DBR 16 formed on the contact layer 14 is a multilayer reflection mirror formed by alternately and repeatedly laminating two semiconductor layers with a film thickness of $0.25\lambda/n$ and with mutually different refraction indexes where $\lambda$ represents an oscillation wavelength of the surface emitting semiconductor laser element 10 and n represents a refraction index of a medium (semiconductor layer). Specifically, the lower DBR 16 is formed by alternately and repeatedly laminating an n-type low refraction index layer made of $Al_{0.09}Ga_{0.1}As$ and an n-type high refraction index layer made of $Al_{0.15}Ga_{0.85}As$. In the surface emitting semiconductor laser element 10 according to the exemplary embodiment, the oscillation wavelength $\lambda$ is set to 850 nm in one example.

The active region 24 according to the exemplary embodiment may include a lower spacer layer, a quantum well active layer, and an upper spacer layer (omitted in the drawing), for example. The quantum well active layer according to the exemplary embodiment may include a barrier layer including 4 layers made of $Al_{0.3}Ga_{0.7}As$ and a quantum well layer including 3 layers made of GaAs provided therebetween. The lower spacer layer and the upper spacer layer have a function of adjusting the length of the resonator by being arranged between the quantum well active layer and the lower DBR 16 and between the quantum well active layer and the upper DBR 26, respectively, and also have a function as a clad layer for sealing a carrier.

The p-type oxidation confining layer 32 provided on the active region 24 is a current confining layer and includes a current injection region 32a and a selective oxidation region 32b. A current flowing from the p-side electrode wiring 36 toward the n-side electrode wiring 30 is confined by the current injection region 32a.

The upper DBE 26 formed on the oxidation confining layer 32 is a multilayer reflection mirror formed by alternately and repeatedly laminating two semiconductor layers with a film thickness of $0.25\lambda/n$ and mutually different refraction indexes. Specifically, the upper DBR 26 is formed by alternately and repeatedly laminating a p-type low refractive index layer made of $Al_{0.90}Ga_{0.1}As$ and a p-type high refraction index layer made of $Al_{0.15}Ga_{0.85}As$.

An emitting surface protection layer 38 that protects a light emitting surface is provided on the contact layer 28. The emitting surface protection layer 38 is formed by depositing a silicon nitride film in one example.

A laser output may be taken out in a direction orthogonal to the substrate from the above-described surface emitting semiconductor laser element. Also, it is possible to easily form an array of surface emitting semiconductor laser elements by two-dimensional integration. Therefore, the surface emitting semiconductor laser element is used as a light source for writing in an electrophotography system or a light source for optical communication.

The surface emitting semiconductor laser element includes a pair of distribution bragg reflectors (the lower DBR 16 and the upper DBR 26) provided on a semiconductor substrate (substrate 12) and an active region (the active region 24 including the active layer, the lower spacer layer, and the upper spacer layer) provided between the pair of distribution bragg reflectors. The surface emitting semiconductor laser element is configured such that a current is injected to the active layer by the electrodes (the p-side electrode wiring 36 and the n-side electrode wiring 30) provided on both the sides of the distribution bragg reflectors, laser oscillation is caused so as to be orthogonal to the substrate surface, and oscillated light is emitted from the upper portion (on the surface side of the contact layer 28) of the element.

In addition, an oxidation confining layer (oxidation confining layer 32) formed by oxidizing the semiconductor layer containing Al in a composition for a low threshold current and traverse mode control is provided, and the element is etched into the mesa shape and is subjected to oxidation treatment to oxidizing the semiconductor layer containing Al. Thereafter, the side surface with the mesa shape exposed by the etching process and the etched semiconductor surface are typically covered with an insulating material such as a silicon nitride film or a silicon oxide film.

In contrast, the surface emitting semiconductor laser element may perform a high-speed modulated operation and has been used in many cases in the field of optical communication and the like. It is necessary to reduce parasitic capacitance to achieve an increase in speed of the surface emitting semiconductor laser element, and in a case of causing the surface emitting semiconductor laser element to perform a modulated operation in a Gbps class, in particular, it is necessary to take the parasitic capacitance of the electrode pad into consideration. The electrode pad typically indicates a metal wiring region for connecting a bonding wire or a metal wiring region for flip-chip bonding in connection of a power source, for example, accompanying implementation of the semiconductor element. The fact that it is necessary to take the parasitic capacitance of the electrode pad into consideration for the high-speed modulated operation is similarly applied to the surface-type light receiving element.

In contrast, the capacitance of the electrode pad is typically reduced by using a polymer material such as polyimide or benzocyclobutene (BCB) with low specific inductive capacity in surface emitting semiconductor laser elements for high-speed modulation that have been reported hitherto. That is, the parasitic capacitance of the electrode pad is reduced by covering the upper surface and the side surface of the mesa structure of the surface emitting semiconductor laser element with the polymer material and forming the electrode pad on the polymer material (see Petter Westbergh, et al., "High-Speed, Low-Current-Density 850 nm VCSELs", IEEE Journal of Selected Topics in Quantum Electronics, Vol. 15, No 3, May/June 2009, for example). However, it is difficult to reduce the manufacturing cost of the element since the polymer material which is originally expensive is used in the related art. In a case of protecting the polymer material by the interlayer insulating film or the like, it is difficult to reduce the manufacturing cost since the number of processes in fabrication increases.

Thus, a configuration of reducing the capacitance of the electrode pads without using the polymer material is employed in the exemplary embodiment. That is, the electrode pads 42a and 42b according to the exemplary embodiment are formed on the semi-insulating GaAs substrate 12 so as to interpose the interlayer insulating film 34 therebetween as illustrated in FIGS. 1A and 1B. That is, the electrode pads 42 are formed by directly forming the interlayer insulating film 34 on the semi-insulating substrate 12 and forming the p-side electrode wiring 36 or the n-side electrode wiring 30 on the interlayer insulating film 34. Here, another configuration is considered in which the n-type contact layer 14 is exposed without exposing the substrate 12 and the interlayer insulating film 34 and the electrode pad 42 are formed on the contact layer 14, as another configuration of the mesa structure M. However, this configuration is not preferable in terms of parasitic capacitance since an equivalent capacitor is formed such that the electrode pad 42 and the n-type contact layer 14 interpose the interlayer insulating film 34. Accordingly, the configuration in which the semi-insulating substrate 12 is exposed and the interlayer insulating film 34 is directly formed on the substrate 12 is employed in the exemplary embodiment. The interlayer insulating film 34 according to the exemplary embodiment is formed of a silicon nitride film as described above. In the case of using the silicon nitride film as the interlayer insulating film 34, the silicon nitride film is formed so as to have a film thickness of equal to or greater than 100 nm and a refraction index of equal to or greater than 1.8 in one example. Forming the film under such conditions prevents penetration of the interlayer insulating film 34 due to impact by wedge during wire bonding, for example.

Furthermore, the method of manufacturing an optical semiconductor element according to the exemplary embodiment includes a process of removing a conductive layer formed on the surface of the substrate 12 by dry-etching as will be described later. For the dry-etching, plasma (discharge) is caused in an apparatus chamber, and a processing target is processed by using ions and radicals generated therein. At this time, the conductive layer may be formed on the surface of the semi-insulating substrate 12 by the ions and the radicals remaining in a state of being implanted in the surface of the substrate 12. In the exemplary embodiment, the conductive layer on the surface of the substrate 12, which is generated by the dry-etching, is removed by acid or alkali treatment (hereinafter, referred to as "pretreatment" in some cases). Forming the interlayer insulating film 34 and the electrode pad 42 in a state where the conductive layer remains is not preferable in terms of parasitic capacitance since an equivalent capacitor is formed such that the electrode pads 42 and the conductive layer interpose the interlayer insulating film 34. In the method of manufacturing an optical semiconductor element according to the exemplary embodiment, the pretreatment is performed after the substrate 12 is dry-etched, and the interlayer insulating film 34 and the electrode pads 42 are formed after removing the conductive layer.

The method of manufacturing an optical semiconductor element according to the exemplary embodiment enables significant reduction of parasitic capacitance without using the polymer material by employing the configuration as described above.

Next, description will be given of an evaluation example related to a capacitance reducing effect of electrode pads according to the exemplary embodiment with reference to FIGS. 2A to 2E.

In the evaluation exemplar, electrode pads with the same shape and the same size are produced under three conditions 1 to 3 illustrated in FIG. 2E, and capacitances of the obtained electrode pads are compared. The electrode pads 42 under the respective conditions have a circular shape with a diameter of 70 μm as illustrated in FIG. 2D. Under the respective conditions, the interlayer insulating films 34 are made of silicon nitride films, and the film thicknesses thereof are commonly set to 775 nm.

As illustrated in FIGS. 2A and 2E, the condition 1 is for a method of manufacturing electrode pads according to a comparative example, in which a GaAs semi-insulating substrate is used as the substrate 12, dry-etching is performed thereon, the interlayer insulating film 34 is formed on the substrate 12 without pretreatment, and the electrode pads 42 are formed on the interlayer insulating film 34. Therefore, the conductive layer 18 formed by the dry-etching remains, and the interlayer insulating film 34 and the electrode pad 42 are formed on the conductive layer 18.

As illustrated in FIGS. 2B and 2E, the condition 2 is for a method of manufacturing the electrode pads according to the exemplary embodiment, in which a GaAs semi-insulating substrate is used as the substrate 12, dry-etching is performed thereon, buffered hydrofluoric acid (BHF) treatment is performed on the substrate 12, the interlayer insulating film 34 is then formed on the substrate 12, and the electrode pads 42 are formed on the interlayer insulating film 34. Therefore, the conductive layer 16 formed by the dry-etching is removed.

As illustrated in FIGS. 2C and 2E, the condition 3 is for a method of manufacturing electrode pads according to a comparative example, in which an n-type GaAs with n-type impurities doped is used as the substrate 12, dry-etching is performed thereon, BHF treatment is performed on the substrate 12, the interlayer insulating film 34 is then formed on the substrate 12, and the electrode pads 42 are formed on the interlayer insulating film 34. Therefore, the conductive layer 18 formed by the dry-etching is removed.

As a result, the capacitance values measured from the electrode pads 42 produced under the aforementioned three conditions are 1.00 pF for the condition 1, 0.02 pF for the condition 2, and 1.00 pF for the condition 3. That is, it is possible to recognize from the evaluation result that the parasitic capacitance is reduced to 1/50 by employing the method of manufacturing an optical semiconductor element according to the exemplary embodiment in which the semi-insulating substrate is used as the substrate, acid treatment is performed after the substrate is dry-etched, the interlayer insulating film is formed on the substrate after being subjected to the acid treatment, and the electrode pads are formed on the interlayer insulating film.

Next, description will be given of a method of manufacturing a surface emitting semiconductor laser element 10 according to the exemplary embodiment with reference to FIGS. 3A to 4E. According to the exemplary embodiment, multiple surface emitting semiconductor laser elements 10 are formed on a single wafer. One of the surface emitting semiconductor laser elements 10 will be illustrated and described below.

Figure 3A:
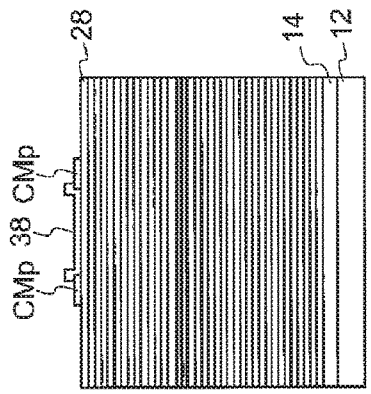
FIGS. 3A to 3F are partial vertical sectional views illustrating an example of a method of manufacturing the surface emitting semiconductor laser element according to the first exemplary embodiment.

As illustrated in FIG. 3A, first, epitaxial growth of the n-type contact layer 14, the n-type lower DBR 16, the active region 24, the p-type upper DBR 26, and the p-type contact layer 28 is caused in this order on the semi-insulating GaAs substrate 12.

At this time, the n-type contact layer 14 is formed so as to have carrier concentration of about $2 \times 10^{18}$ cm$^{-3}$ and a film thickness of about 2 μm in one example. The n-type lower DBR 16 is formed by alternately laminating, in 37.5 cycles, an $Al_{0.15}Ga_{0.85}As$ layer and an $Al_{0.9}Ga_{0.1}As$ layer with a film thickness of ¼ of the wavelength λ/n in the medium in one example. The carrier concentration of an $Al_{0.3}Ga_{0.7}As$ layer and the carrier concentration of an $Al_{0.9}Ga_{0.1}As$ layer are about $2 \times 10^{18}$ cm$^{-3}$, respectively, and the total film thickness of the lower DBR 16 is set to about 4 μm. In one example, Si (silicon) is used as the n-type carrier.

In one example, the active region 24 includes a lower spacer layer made of a non-doped $Al_{0.6}Ga_{0.4}As$ layer, a non-doped quantum well active layer, and an upper spacer layer made of non-doped $Al_{0.6}Ga_{0.4}As$. The quantum well active layer includes four barrier layers made of $Al_{0.3}Ga_{0.7}As$ and 3 quantum well layers made of GaAs provided between the respective barrier layers, for example. The film thickness of each barrier layer made of $Al_{0.3}Ga_{0.7}As$ is set to about 8 nm, the film thickness of each quantum well layer made of GaAs is set to about 8 nm, and the film thickness of the entire active region 24 is set to the wavelength λ/n in the medium.

The p-type upper DBR 26 is formed by alternately laminating, in 25 cycles, an $Al_{0.15}Ga_{0.85}As$ layer and an $Al_{0.9}Ga_{0.1}As$ layer with the film thickness of ¼ of λ/n in the medium in one example. At this time, the carrier concentration of the $Al_{0.15}Ga_{0.85}As$ and the carrier concentration of the $Al_{0.9}Ga_{0.1}As$ are set to about $4 \times 10^{18}$ cm$^{-3}$, respectively, and the total film thickness of the upper DBR 26 is set to about 3 μm. In one example, carbon (C) is used as the p-type carrier. Furthermore, an AlAs layer 40 for forming the oxidation confining layer 32 in a process described below is included in the upper DBR 26.

In one example, the p-type contact layer 28 is formed so as to have carrier concentration of equal to or greater than about $1 \times 10^{19}$ cm$^{-3}$ and a film thickness of about 10 nm.

Figure 3B:
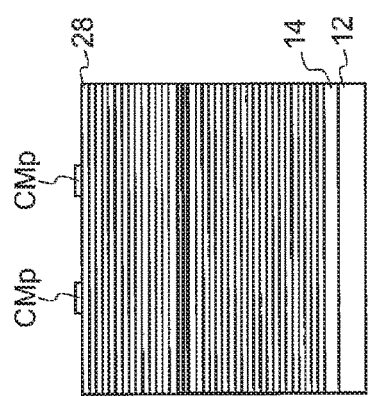

Next, a film of an electrode material is formed on the contact layer 28 of the wafer after completion of the epitaxial growth, the material is then dry-etched by using a mask of photolithography, for example, and contact metal CMp for extracting the p-side electrode wiring 36 is formed as illustrated in FIG. 3B. In one example, the contact metal CMp is formed by using a Ti/Au laminated film.

Figure 3C:
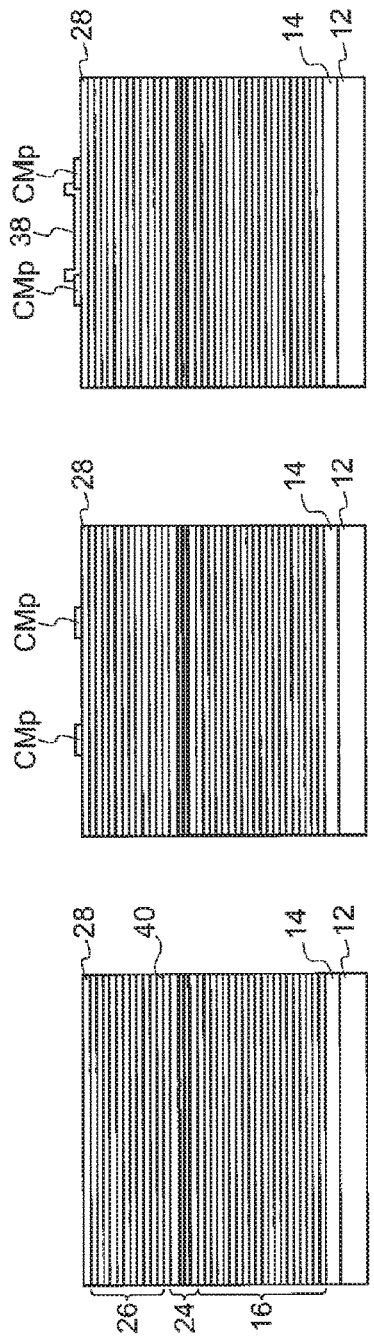

Next, a film of a material of the emitting surface protection layer is formed on the wafer surface, the material is then dry-etched by using a mask of photolithography, for example, and the emitting surface protection layer 38 is formed as illustrated in FIG. 3C. A silicon nitride film is used as the material of the emitting surface protection layer 38 in one example.

Figure 3D:
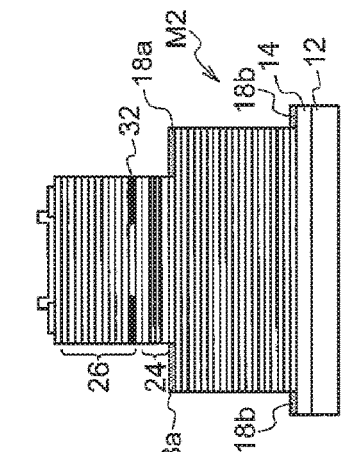

Next, a mask is formed on the wafer surface by photolithography and etching, and dry-etching is performed by using the mask, and a mesa M1 is formed as illustrated in FIG. 3D. At this time, a conductive layer 18a is formed by ions and radicals generated by the dry-etching and remaining in a state of being implanted in a dry-etched bottom surface.

Figure 3E:
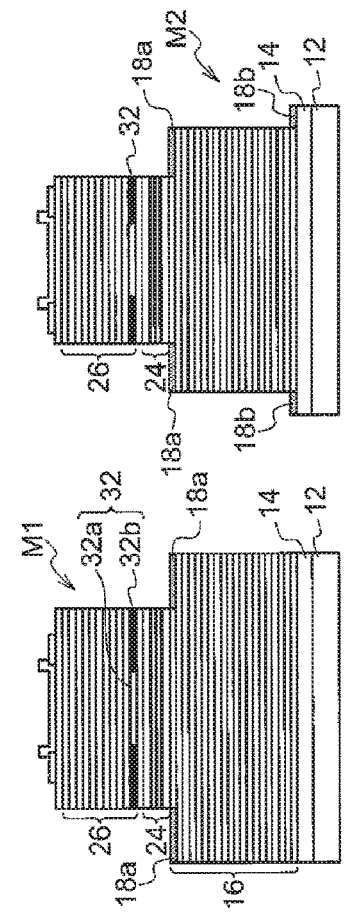

Next, the wafer is subjected to oxidation treatment to oxidize an AlAs layer 40 from the side surface, and the oxidation confining layer 32 is formed in the mesa M1 as illustrated in FIG. 3E. The oxidation confining layer 32 includes the current injection region 32a and the selective oxidation region 32b. The selective oxidation region 32b corresponds to the region oxidized by the above oxidation treatment, and a region that remains without being oxidized corresponds to the current injection region 32a. The current injection region 32a has a circular shape or a substantially circular shape. The current injection region 32a confines a current flowing between the p-side electrode wiring 36 and the n-side electrode wiring 30 of the surface emitting semiconductor laser element 10, and controls the traverse mode in the oscillation of the surface emitting semiconductor laser element 10, for example.

Figure 3F:
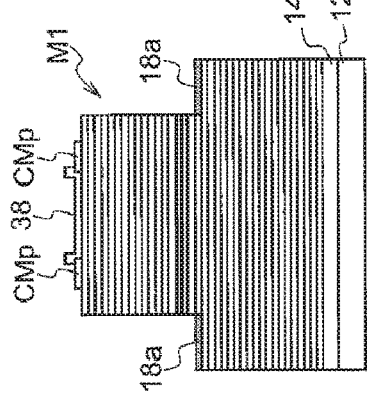

Next, a mask is formed on the wafer surface by photolithography and etching, dry-etching is performed by using the mask, and a mesa M2 is formed as illustrated in FIG. 3F. At this time, a conductive layer 18b is formed on the dry-etched bottom surface.

Next, a mask is formed on the wafer surface by photolithography and etching, and dry-etching is performed by using the mask, and a mesa M3 is formed as illustrated in FIG. 4A. At this time, a conductive layer 18c is formed on the dry-etched bottom surface.

Next, the conductive layers 18a, 18b, and 18c are removed as illustrated in FIG. 4B by performing the pretreatment, that is, acid or alkali treatment on the wafer. The pretreatment according to the exemplary embodiment is performed before forming the interlayer insulating film 34 after completing all the dry-etching.

A film of an electrode material is formed on the contact layer 14, the material is then dry-etched by using a mask of photolithography, for example, and contact metal CMn for extracting the n-side electrode wiring 30 is formed as illustrated in FIG. 4C. The contact metal CMn is formed by using an AuGe/Ni/Au laminated film in one example.

Next, the interlayer insulating film 34 made of a silicon nitride film is formed in a region except for the emitting surface protection layer 38 of the wafer and the contact metal CMp and CMn as illustrated in FIG. 4D.

Next, a film of an electrode material is formed on the wafer surface, the electrode material is dry-etched by a mask of photolithography, for example, and the p-side electrode wiring 36, the electrode pad 42a, the n-side electrode wiring 30, and the electrode pad 42b (omitted in the drawing) are formed as illustrated in FIG. 4E. The p-side electrode wiring 36, the electrode pad 42a, the n-side electrode wiring 30, and the electrode pad 42b are formed by using a Ti/Au laminated film in one example. The p-side electrode wiring 36 is connected to the contact metal CMp, and the n-side electrode wiring 30 is connected to the contact metal CMn by the process.

Next, the surface emitting semiconductor laser element 10 is diced at a dicing region, which is not shown in the drawing, and is separated into individual pieces. The surface emitting semiconductor laser element 10 with the electrode pads 42 according to the exemplary embodiment is manufactured by the aforementioned processes.

Second Exemplary Embodiment

Description will be given of a light receiving element 50 according to an exemplary embodiment with reference to FIGS. 5A and 5B. The exemplary embodiment is achieved by applying the method of manufacturing an optical semiconductor element according to the exemplary embodiment of the invention to a light receiving element.

Figure 5A:
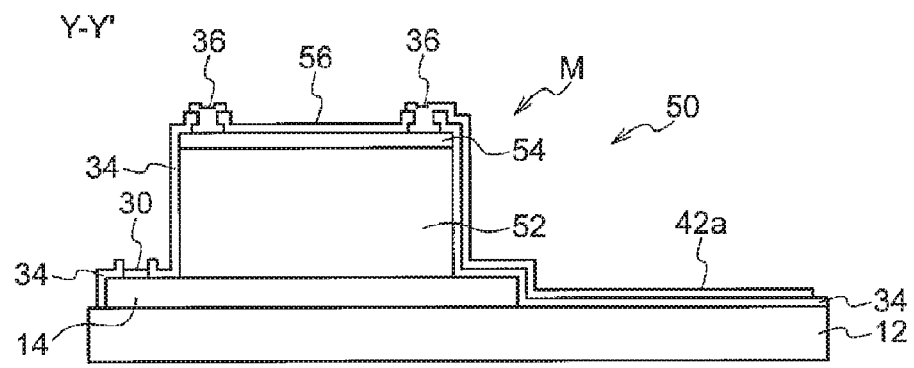
FIGS. 5A and 5B are a sectional view and a plan view illustrating an example of a configuration of a light receiving element according to a second exemplary embodiment.
Figure 5B:
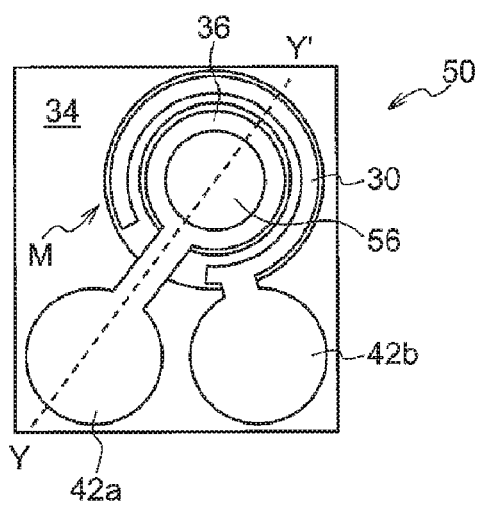

The light receiving element 50 includes the n-type contact layer 14, a light absorption layer 52, a p-type contact layer 54, and non-reflecting coating 56 that are formed on the semi-insulating GaAs substrate 12 as illustrated in FIGS. 5A and 5B. In the light receiving element 50, the respective configurations including the contact layer 14, the light absorption layer 52, the contact layer 54, and the non-reflecting coating 56 form a mesa structure M, and the mesa structure M forms a light receiving portion for receiving light that is incident via the non-reflecting coating 56.

An interlayer insulating film 34 as an inorganic insulating film is deposited on the circumference of the semiconductor layer including the mesa structure M. The interlayer insulating film 34 extends from a side surface of the mesa structure M to a surface of the substrate 12 and is arranged below an electrode pad 42a. The interlayer insulating film 34 according to the exemplary embodiment is formed of a silicon nitride film in one example. The material of the interlayer insulating film 34 is not limited to the silicon nitride film and may be a silicon oxide film or a silicon oxynitride film, for example.

As illustrated in FIG. 5A, the p-side electrode wiring 36 is provided via an opening of the interlayer insulating film 34. One end of the p-side electrode wiring 36 is connected to the contact layer 54 and forms Ohmic contact with the contact layer 54. In contrast, the other end of the p-side electrode wiring 36 extends from the side surface of the mesa structure M to the surface of the substrate 12 and forms the electrode pad 42a. The p-side electrode wiring 36 is formed by depositing a Ti/Au laminated film, for example.

Similarly, an n-side electrode wiring 30 is provided via an opening of the interlayer insulating film 34. One end of the n-side electrode wiring 30 is connected to the contact layer 14 and form Ohmic contact with the contact layer 14. In contrast, the other end of the n-side electrode wiring 30 extends to the surface of the substrate 12 and forms the electrode pad 42b as illustrated in FIG. 5B. The n-side electrode wiring 30 is formed by depositing an AuGe/Ni/Au laminated film, for example.

In one example, a semi-insulating GaAs substrate is used as the substrate 12 according to the exemplary embodiment. One end of the n-type contact layer 14 formed on the substrate 12 is connected to the light absorption layer 52, the other end is connected to the n-side electrode wiring 30, and a positive potential is applied to the light absorption layer 52. The contact layer 14 is formed of a Si-doped GaAs layer in one example.

The light absorption layer 52 is a layer that absorbs light and converts the light into pairs of electrons and holes and is formed of a GaAs layer with impurity concentration that is set to be significantly low.

One surface of the p-type contact layer 54 is connected to the light absorption layer 52, the other surface is connected to the p-side electrode wiring 36, and a negative potential is applied to the light absorption layer 52. The contact layer 54 is formed of a C-doped GaAs layer in one example.

The light receiving element 50 with the aforementioned configuration forms a so-called PIN photodiode, and the light absorption layer 52 is depleted by applying a positive potential to the n-side electrode wiring 30 and applying a negative potential to the p-side electrode wiring (that is, applying opposite biases). As a result, an electric field is applied to the entire light absorption layer 52, and the pairs of electrons and holes generated by the light that is incident via the non-reflecting coating 56 move to the contact layer 14 and the contact layer 54, respectively, at a saturation speed. By this effect, a current in accordance with an input optical signal flows through the light receiving element 50, and the light receiving element 50 converts the input optical signal into an electric signal.

As illustrated in FIGS. 5A and 5B, the electrode pad 42a in the light receiving element 50 is also formed by depositing the p-side electrode wiring on the interlayer insulating film 34 that is directly formed on the substrate 12 obtained by using semi-insulating GaAs. The electrode pad 42b is formed by depositing the n-side electrode wiring on the interlayer insulating film 34 that is directly formed on the substrate 12.

A method of manufacturing the light receiving element 50 is based on the method of manufacturing the surface emitting semiconductor laser element 10 illustrated in FIGS. 3A to 3F and 4A to 4E. That is, the electrode pads 42a and 42b are formed by performing acid or alkali pretreatment (conductive layer removing treatment) on the substrate after dry-etching, then forming the interlayer insulating film 34, and forming the p-side electrode wiring 36 or the n-side electrode wiring 30 on the interlayer insulating film 34.

According to the exemplary embodiment, the light receiving element with the electrode pads that significantly reduce parasitic capacitance is obtained as described above.

Although the GaAs-based surface emitting semiconductor laser element using the semi-insulating GaAs substrate is exemplified in the above embodiments, the exemplary embodiments are not limited thereto, and a gallium nitride (GaN) or indium phosphide (InP) substrate may be used.

Although the above embodiments in which the n-type contact layer is formed on the substrate is exemplified in the above description, the exemplary embodiments are not limited thereto, and a p-type contact layer may be formed on the substrate. In such a case, it is only necessary to replace the n-type in the above description with the p-type.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method of manufacturing an optical semiconductor element comprising:
a first step in which a columnar structure of a semiconductor layer formed on a semi-insulating substrate and including a first contact layer of a first conductivity type, an active region or a light absorption region on the first contact layer, a second contact layer of a second conductivity type on the active region or the light absorption region, and a second electrode on the second contact layer is formed by dry-etching the semiconductor layer until the first contact layer is exposed;
a second step in which the substrate is exposed in a periphery of the columnar structure by dry-etching the first contact layer;
a third step in which a region including an exposed surface of the first contact layer exposed by the dry-etching and an exposed surface of the substrate is pretreated with acid or alkali;

a fourth step in which a first electrode is formed on the exposed surface of the first contact layer;

a fifth step in which an interlayer insulating film is formed in a region including a side surface of the columnar structure, the exposed surface of the first contact layer, and the exposed surface of the substrate;

a sixth step in which a first electrode wiring connected to the first electrode and extending to the exposed surface of the substrate is formed on the interlayer insulating film, and a first electrode pad is formed on the exposed surface of the substrate; and a seventh step in which a second electrode wiring connected to the second electrode and extending to the exposed surface of the substrate via the side surface of the columnar structure is formed on the interlayer insulating film, and a second electrode pad is formed on the exposed surface of the substrate.

2. The method of manufacturing the optical semiconductor element according to claim 1, wherein the fifth step is a step in which a silicon nitride film with a film thickness of equal to or greater than 100 nm and a refraction index of equal to or greater than 1.8 is formed.

3. The method of manufacturing the optical semiconductor element according to claim 2, wherein the optical semiconductor element is a surface emitting semiconductor laser element, and wherein the semiconductor layer includes the first contact layer of the first conductivity type, a first semiconductor multilayer reflection mirror of the first conductivity type formed on the first contact layer, a quantum well active layer formed on the first semiconductor multilayer reflection mirror and serving as the active region, a second semiconductor multilayer reflection mirror of the second conductivity type formed on the quantum well active layer, the second contact layer formed on the second semiconductor multilayer reflection on mirror, and the second electrode formed on the second contact layer.

4. The method of manufacturing the optical semiconductor element according to claim 3, wherein the first step includes a step in which a mesa structure is formed by dry-etching the semiconductor layer to expose a surface of the first semiconductor multilayer reflection mirror, and the step in which the columnar structure of the semiconductor layer is formed by the dry-etching until the first contact layer is exposed is a step in which a columnar structure of the first semiconductor multilayer reflection mirror is formed by dry-etching the first semiconductor multilayer reflection mirror until the first contact layer is exposed, and wherein the third step is a step in which the exposed surface of the first semiconductor multilayer reflection mirror, which is exposed by the dry-etching, is further pretreated.

5. The method of manufacturing the optical semiconductor element according to claim 2, wherein the optical semiconductor element is a light receiving element, and wherein the semiconductor layer includes the first contact layer of the first conductivity type, a light absorption layer as the light absorption region, the second contact layer formed on the light absorption layer, and the second electrode formed on the second contact layer.

6. The method of manufacturing the optical semiconductor element according to claim 1, wherein the optical semiconductor element is a surface emitting semiconductor laser element, and wherein the semiconductor layer includes the first contact layer of the first conductivity type, a first semiconductor multilayer reflection mirror of the first conductivity type formed on the first contact layer, a quantum well active layer formed on the first semiconductor multilayer reflection mirror and serving as the active region, a second semiconductor multilayer reflection mirror of the second conductivity type formed on the quantum well active layer, the second contact layer formed on the second semiconductor multilayer reflection mirror, and the second electrode formed on the second contact layer.

7. The method of manufacturing the optical semiconductor element according to claim 6, wherein the first step includes a step in which a mesa structure is formed by dry-etching the semiconductor layer to expose a surface of the first semiconductor multilayer reflection mirror, and the step in which the columnar structure of the semiconductor layer is formed by the dry-etching until the first contact layer is exposed is a step in which a columnar structure of the first semiconductor multilayer reflection mirror is formed by dry-etching the first semiconductor multilayer reflection mirror until the first contact layer is exposed, and wherein the third step is a step in which the exposed surface of the first semiconductor multilayer reflection mirror, which is exposed by the dry-etching, is further pretreated.

8. The method of manufacturing the optical semiconductor element according to claim 1, wherein the optical semiconductor element is a light receiving element, and wherein the semiconductor layer includes the first contact layer of the first conductivity type, a light absorption layer as the light absorption region, the second contact layer formed on the light absorption layer, and the second electrode formed on the second contact layer.

* * * * *